United States Patent [19]

Lee

[11] Patent Number: 4,489,397
[45] Date of Patent: Dec. 18, 1984

[54] CHAIN CONFIGURABLE POLYCELLULAR WAFER SCALE INTEGRATED CIRCUIT

[75] Inventor: Kin H. Lee, Stockport, England

[73] Assignee: Burroughs Corporation, Detroit, Mich.

[21] Appl. No.: 573,588

[22] Filed: Jan. 24, 1984

Related U.S. Application Data

[63] Continuation of Ser. No. 293,800, Aug. 18, 1981, abandoned.

[30] Foreign Application Priority Data

Aug. 21, 1980 [GB] United Kingdom ............... 8027212

[51] Int. Cl.³ .................................................. G06F 1/00
[52] U.S. Cl. .................................................. 364/900
[58] Field of Search ... 364/200 MS File, 900 MS File

[56] References Cited

U.S. PATENT DOCUMENTS

| | | | |
|---|---|---|---|
| 3,475,733 | 10/1969 | Gaines et al. | 365/49 |
| 3,900,837 | 8/1975 | Hunter | 365/200 |
| 3,913,072 | 10/1975 | Catt | 364/900 |
| 4,037,205 | 7/1977 | Edelberg et al. | 364/900 |
| 4,038,648 | 7/1977 | Chesley | 364/900 |
| 4,255,672 | 3/1981 | Ohno et al. | 307/455 |

FOREIGN PATENT DOCUMENTS

| | | |
|---|---|---|
| 2311385 | 10/1976 | France . |
| 1377859 | 12/1974 | United Kingdom . |
| 1525048 | 9/1978 | United Kingdom . |

OTHER PUBLICATIONS

Manning, "An Approach to Highly Integrated, Computer-Maintained Cellular Arrays", *IEEE Trans. on Computers*, vol. C-26, No. 6, Jun. 1977, pp. 536-552.

Aubusson et al., "Water-Scale Integration-A Fault-Tolerant Procedure" *IEEE Journal of Solid-State Circuits*, vol. SC-13, No. 3, Jun. 1978, pp. 339-344.

Finnila et al., "The Associative Linear Array Processor", *IEEE Trans. on Computers*, vol. C-26, No. 2, Feb. 1977, pp. 112-125.

Egawa et al., "Memory Technology", *1979 IEEE International Solid State Circuits Conference*, Feb. 1979, pp. 18-19.

*Primary Examiner*—Raulfe B. Zache
*Attorney, Agent, or Firm*—David G. Rasmussen; Kevin R. Peterson; Edmund M. Chung

[57] ABSTRACT

A digital memory system comprises a wafer full of uncommitted but interconnectable memory cells and a controller acting as an interface between the wafer and a host system. Each cell comprises input logic to allow coupling thereto from just one other neighboring cell and output logic allowing a cell to be commanded by the controller to couple to any selectable one other neighboring cell not already so coupled to. The controller accesses the wafer via a port and successively tests and couples cells from the port to form a chain of memory cells. Each cell comprises a plurality of individually selectably usable data storage loops and allows a cell to be used even if the loops are not fully functional by the provision of through-passing data transfer path.

13 Claims, 17 Drawing Figures

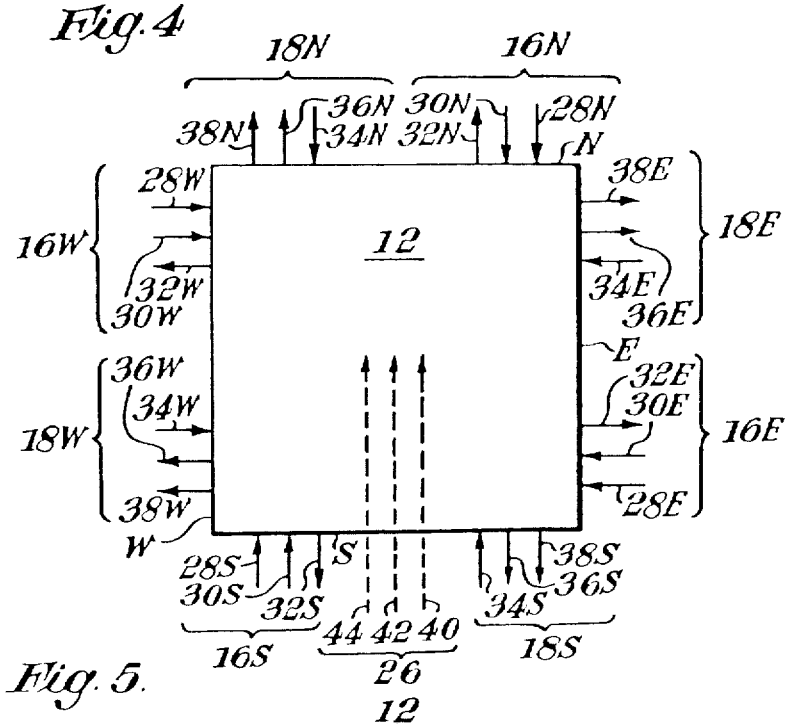
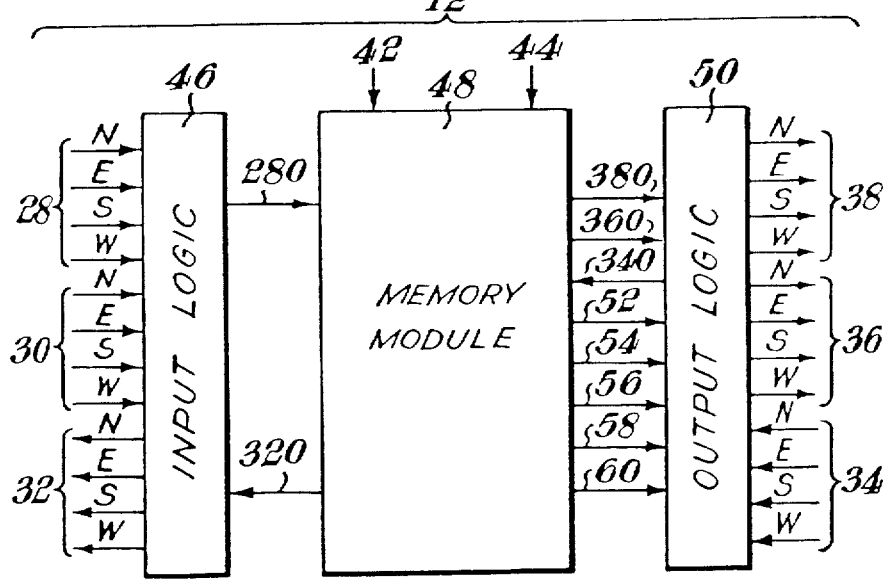

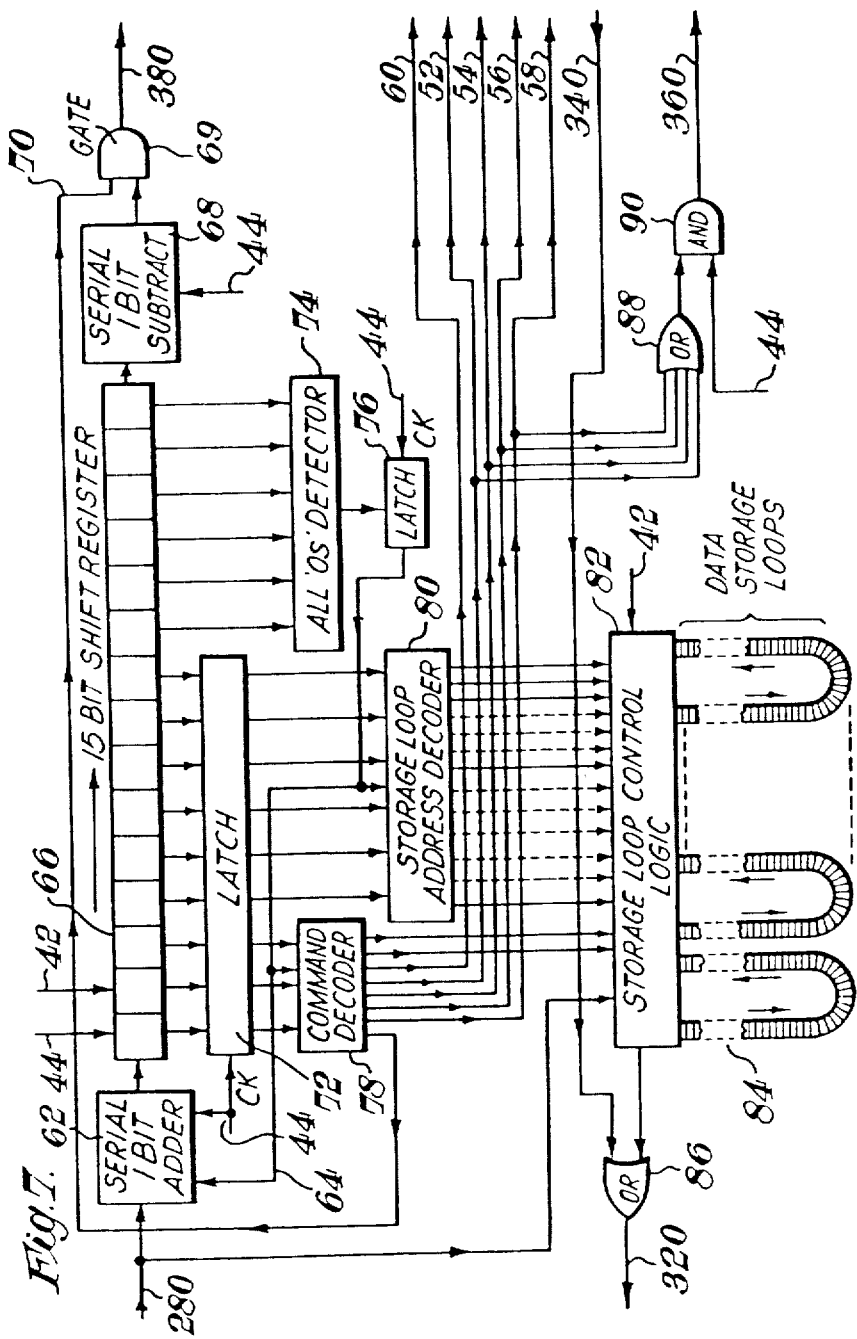

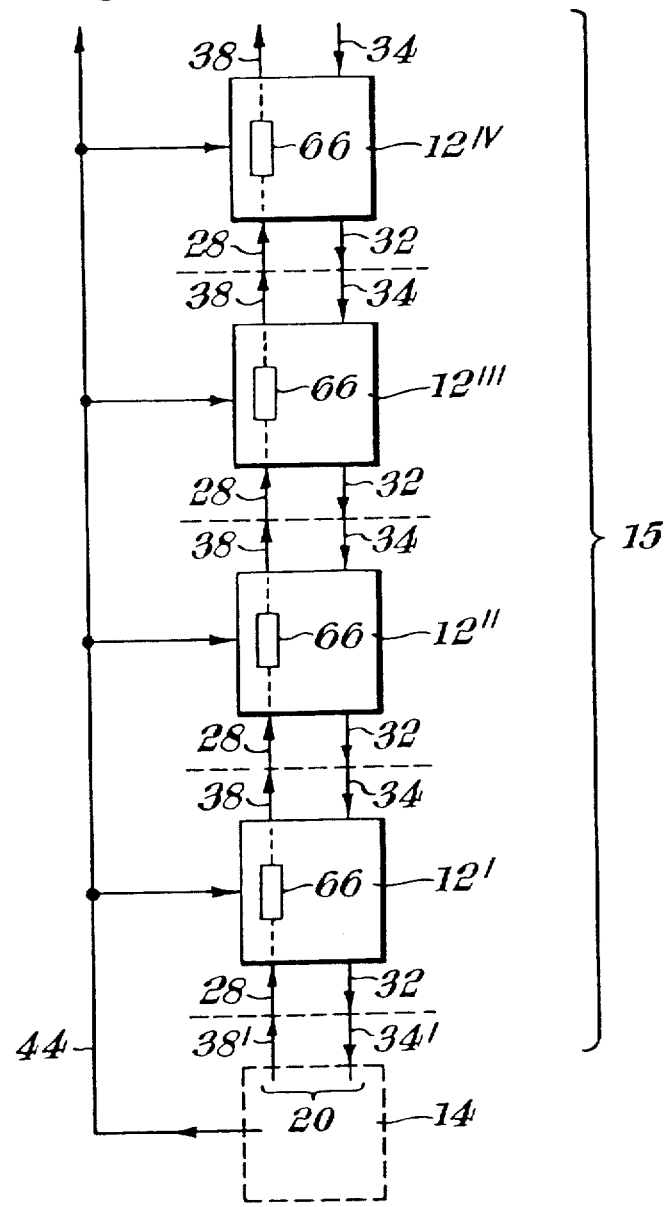

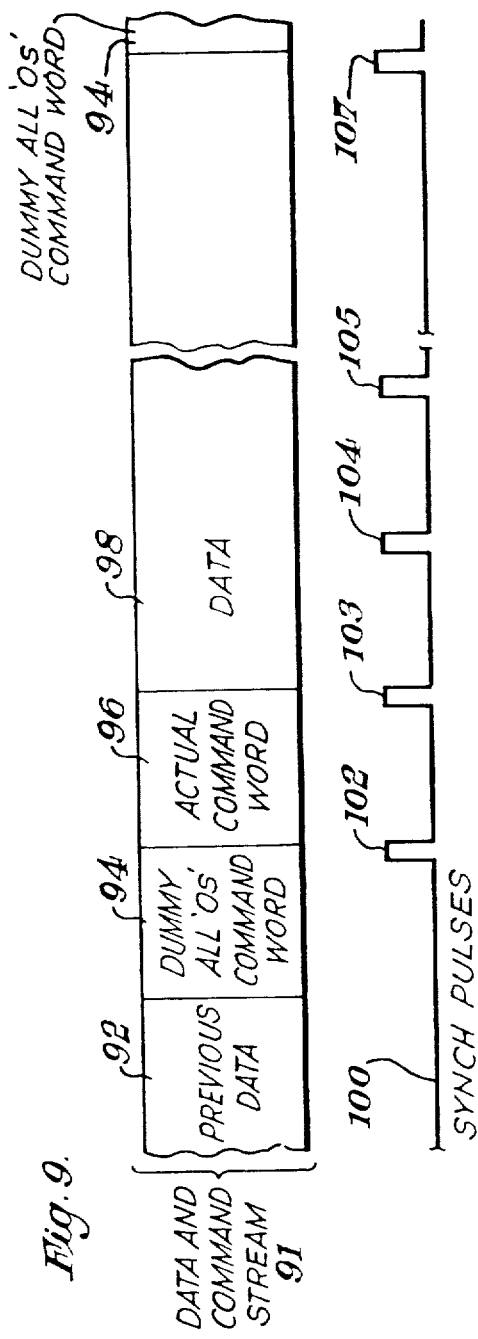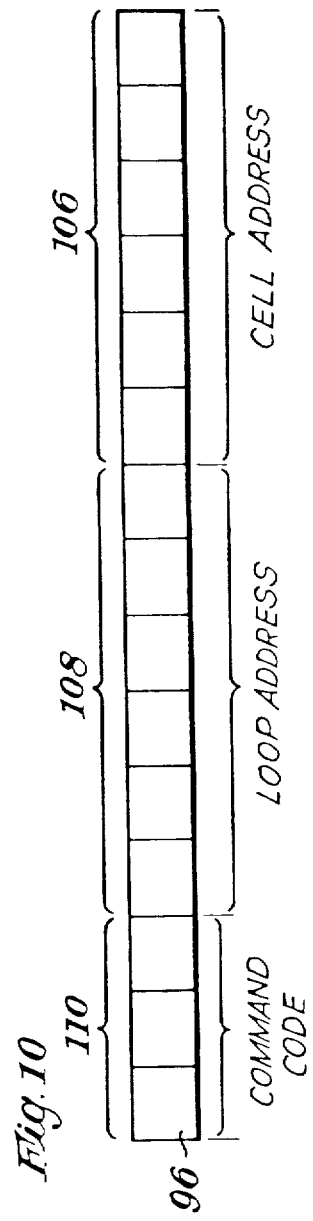

CHAIN CONFIGURABLE POLYCELLULAR WAFER SCALE INTEGRATED CIRCUIT

This application is a continuation of application Ser. No. 293,800, filed 8/18/81, now abandoned.

BACKGROUND OF THE INVENTION

1. Field of the Invention

The present invention relates to a wafer-scale integrated circuit wherein a plurality of integrated circuit cells are fabricated on a semiconductor wafer, together with a port for external coupling thereto, a first of said cells being accessible from said port and operable to establish functional coupling to a neighboring cell, the neighboring cell being similarly operable to establish functional coupling to another neighboring cell, and so on, until a serpentine chain of functionally intercoupled cells is provided on the wafer.

2. The Prior Art

It is known to provide an integrated circuit, suitable for fabrication over the entire surface of a semi-conducter wafer upwards of 6 cm in diameter, wherein the inherent failure rate for fabrication of such a large circuit is overcome by providing that the circuit comprises a plurality of substantially independent cells which may be independently tested and incorporated into the overall working of the circuit if found to be functional, non-functional cells being excluded from the circuit. It is generally the case that starting at a coupling port, provided on the wafer for external coupling thereto, a first cell in its vicinity is coupled to and tested. If the first cell works to an acceptable standard, the first cell is commanded to couple to a second, neighboring cell and it too is tested. If the second cell fails the test another neighbor is selected for testing. If the second cell passes the test it is commanded to couple to a third cell so that it too may be tested, the third cell thereafter coupling to a fourth cell, and so on until a serpentine chain of tested, acceptably functional intercoupled cells is formed on the surface of the wafer. When the chain comprises sufficient elements, its growth is terminated and the chain used as a data processing element.

It is also known that such cells in a wafer-scale circuit comprise coupling elements for coupling to neighboring cells, supervisory elements for control within each cell, and data processing elements for performing the data processing functions which are the purpose for the existence of that cell. In the prior art it has been a requirement that, in order to pass the functional test, a cell has had to be entirely functional, failure of any part of its various elements being sufficient to exclude that cell from any kind of use.

In the growth of a chain of intercoupled cells on a wafer, it is often the case that the tip of the chain becomes boxed in by surrounding cells which do not pass the functional test and therefore inhibit further growth. In the worst case whole areas of the wafer may be excluded from access from the coupling port by being surrounded by cells which fail testing.

In the particular case of such cells being used for data storage, that is, as an integrated circuit memory, it is usual that the internal configuration of each cell consists of one or more shift registers coupled in series. If any one element of any one of the shift registers fails, the entire cell is useless. In addition, the constant movement of data within the shift register or registers, and as is commonly the case, between the adjacent cells, makes keeping track of the location of data records and access thereto extremely difficult.

It is therefore desirable to provide such a cell which is tolerant of at least partial failure of the elements therein. It is also desirable to provide a cell which will not inhibit growth despite partial or total loss of data processing capacity, thereby allowing access to other cells where said capacity may be obtained. It is yet further desirable to provide a cell, for data storage, wherein the location of data records is fixed.

SUMMARY OF THE INVENTION

The present invention is hereinafter described with reference to use as an integrated circuit memory. It is to be appreciated that this is intended as an example of and not a limitation on its use.

Functional coupling is heretofore and hereinafter defined as coupling for the transfer of data and/or commands.

The present invention consists in an integrated circuit comprising a plurality of cells, at least one of said cells being operable to have functional coupling established thereto from a first neighboring cell and thereafter to establish functional coupling to a second neighboring cell, said at least one of said cells comprising a plurality of selectably operable data processing members and characterized by being operable to act as a functional coupling between said first neighboring cell and said second neighboring cell even if some or all of said data processing elements are faulty.

BRIEF DESCRIPTION OF THE PREFERRED EMBODIMENT

In a preferred embodiment a semiconducting wafer has fabricated thereon a plurality of integrated circuit cells arranged in a regular tessellation. Each cell is preferably operable to have functional coupling established thereto from a first neighboring cell and thereafter to establish functional coupling to a second neighboring cell. A neighboring cell is preferably one sharing a common boundary. The second neighboring cell is preferably selectable. The cells are preferably square.

The wafer is preferably provided with a coupling port or ports formed by the omission of one or more cells from the tessellation and the provision of external coupling pads on one or more boundaries thereof providing functional coupling to the cell or cells adjacent thereto. The port or ports is or are preferably at or near the center of the wafer.

The cells are preferably functionally couplable to form a chain or chains beginning at the port or ports. Each boundary of each cell is preferably provided with first coupling means for functionally coupling to cells later in the chain and second coupling means for functionally coupling to cells earlier in the chain. The activation of the first coupling means on a boundary preferably inhibits the later activation of the second coupling means on that boundary and vice versa. The cells preferably resist functional coupling from more than one cell earlier in a chain.

The cells preferably comprise input logic, a data processing module, and output logic, the input logic preferably controlling the switching and connection of all second coupling means in a cell, the output logic preferably controlling the switching and connection of all first coupling means in a cell, and the data processing module comprising means for functionally coupling the input logic to the output logic and a plurality of selectably operable data processing elements. The data processing elements are preferably data stores in which case they preferably comprise selectably operable shift registers.

The invention is further described, by way of an example, by the following description in conjunction with the appended drawings, in which;

BRIEF DESCRIPTION OF THE DRAWINGS

FIG. 4 shows details of the connections to an individual cell.

FIG. 5 shows schematically, the internal structure of a cell.

FIG. 7 shows, schematically, the internal structure of the memory module of FIG. 5.

FIG. 8 shows details of the intercouplings within a chain.

FIG. 9 shows the data and command stream delivered to a chain.

FIG. 10 shows a command word.

FIG. 1 shows a circular, semiconductor wafer 10 for use as an integrated circuit memory. The wafer 10 is coupled to a controller 11. The controller 11 passes instructions and data into the wafer 10 and the wafer 10 passes recovered data back to the controller 11. The wafer 10 comprises a plurality of square, data storage cells 12 arranged in a square tessellation on the surface of the wafer 10 such that each cell 12 has a common boundary with each of four neighboring cells 12. The cells each comprise circuitry for decoding instructions from the controller 11, a plurality of selectably addressable data storage shift registers, and coupling circuitry responsive to an initiation from any one neighboring cell to functionally couple thereto and responsive to instructions from the controller 11 to initiate coupling to one further selectable neighboring cell. The controller 11 is mutually coupled to a host system 13 which might be a digital telecommunications link, a data processor, or indeed any piece of digital equipment requiring the use of a high capacity peripheral memory. The controller 11, whenever power is first applied, or when requested to do so by the host 13, by issuing instructions to the wafer 10 to couple cells 12 together one by one and issuing data to be stored in each newly coupled cell 12 and recovering the data therefrom to test its validity and therefore the integrity of that cell and selecting another cell should that cell fail the data integrity test, establishes a chain of tested, working cells 12 on the wafer for later use by the host 13. The controller 11 grows the chain of cells 12 in one or more spirals around a coupling port 14, made by the omission of one cell 12 from the tessellation and providing external coupling pads along one or more of its boundary edges by which the controller 11 is coupled to the wafer 10. The length of the chain of cells 12 established by the controller 11 is either a predetermined feature of the controller 11 or is communicated to the controller 11 by the host 13. The coupling port 14 is preferably, but not essentially, at or near the center of the wafer 10. There may be more than one coupling port 14.

FIGS. 2A to 2E show by way of example, the growth of a spiral of cells 12 around the coupling port 14 on a wafer 10 having no non-functional cells 12. The growth is here shown from only one boundary of the port 14.

FIG. 2A shows the controller 11 sending the initiating signal into the first cell A, being the first cell in the chain 15. On receipt of the initiating signal the first cell A functionally couples to the port 14 so that instructions and data may be received from the controller 11. The controller 11 then provides data patterns and commands the first cell A to store the data in each of its data storage registers. The controller 11 then commands the first cell A to give back the data stored in its registers and checks the data to see that it is the same as was written therein. If the data is the same, the first cell A has passed the functional test.

FIG. 2B shows the second state of growth of the chain 15. The first cell A having been tested and found functional, the controller 11 instructs the first cell A to send the initiating signal to the second cell B. In the particular case shown and taking the top of the figure as a northerly direction, the second cell B happens to lie in a westerly direction from the first cell A, but the controller would have been at liberty to instruct the first cell A to send the initiating signal to any other one of the other two cardinal points of the compass. The second cell B then functionally couples to the first cell A. Instructions and data from the controller 11 may then be passed to the second cell B by way of the first cell A. The controller executes the same functional test on the second cell B as it did on the first cell A. If the second cell B does not pass the functional test, then the controller 11 instructs the first cell A to cease sending the initiating signal to the second cell B and to send it to a selectable one of the other two neighboring cells. In this example, since there are no non-functional cells 12 on the wafer 10, the second cell B passes the functional test.

FIG. 2C shows the addition of a third cell C to the chain 15. The second cell B having passed the functional test, is instructed by the controller 11 to send the initiating signal to the next cell C in a southerly direction. On receipt of the initiating signal, the third cell C functionally couples to the second cell B. The controller 11 then sends data and commands, relayed via the first cell A and the second cell B to the third cell C and thereby functionally tests the third cell.

FIG. 2D shows the addition of a fourth cell D to the chain 15. The third cell C having passed the functional test, the controller 11 commands the third cell C to send the initiating signal to the fourth cell D, in response to which the fourth cell D functionally couples to the third cell C. The controller 11 then sends commands and data to the fourth cell D via the first cell A, the second cell B, and the third cell C and tests the fourth cell D. In this example, the controller 11 commands the third cell C to send the initiating signal to the cell D to its south. If the controller 11 had commanded the third cell C to send the initiating signal to the east, then the third cell C would have tried to couple to a blank edge of the port 14, and the functional test would not have been passed. Thereafter the controller 11 would have tested in another direction from the third cell C.

FIG. 2D also shows the addition of a fifth cell E into the chain 15, where the controller 11 commands the fourth cell D to send the initiating signal to the fifth cell E to the south.

FIG. 2E shows an advanced stage of growth of the chain 15 where 37 cells have been incorporated. The chain 15 is prevented from linking back onto itself by each cell 12 being resistant to receiving the initiating signal from more than one direction at once. Each cell 12, upon the receipt of the initiating signal from a first direction, functionally couples back into the source of the signal. If the cell 12 should subsequently receive the initiating signal from a second direction, so that it receives the signal from two directions at once, it ignores the second signal, does not couple to the second source, and remains coupled to the first source. In this way, should a later cell 12 in the chain 15 try to initiate testing in an earlier cell 12 in the chain 15, the earlier cell 12 resists coupling thereto and will therefore "fail" the functional test, since no data or command signals can be passed into it from the last cell 12 in the chain 15. The controller 11 will then be forced to seek some other cell 12 for the last cell 12 in the chain 15 to couple to. Should a cell 12 cease receiving an initiating signal from any direction, so that no initiating signal at all is received, the cell 12 abandons its functional coupling to any neighbors. The chain can thereby be back-tracked.

FIG. 2F shows how the chain 15 of FIGS. 2A to 2E becomes a modified chain 15A when grown on a wafer 10 having non-functional cells, here indicated by crosses. In attempting to test a non-functional cell X the controller notes the failure of the non-functional cell to give back the data ostensibly stored therein. The controller 11 then choses another direction to test in until it finds a good cell 12. The modified chain 15A can therefore be made to skirt around bad cells. In the event of the last cell 12 in the chain 15A being surrounded by bad cells, so that no subsequent direction of test produces a successful result, the controller 11 commands the penultimate cell 12 in the chain 15A to abandon its sending of the initiating signal to the final cell 12, thereby making the penultimate cell 12 the new last cell and so back-tracking the chain 15A since the last cell 12, on the dropping of the initiating signal thereto, abandons functional coupling to the penultimate cell 12. Testing in different directions from what was the penultimate cell 12 is then undertaken, ignoring the direction of what was the last cell. Should at a later stage the same problem occur, further back-tracking is undertaken.

During the growth phase, the controller 11 keeps a tally of how many cells 12 are incorporated into the chain 15 or 15A, and ceases the growth thereof when a sufficient number of cells 12 have been incorporated therein to satisfy the memory capacity requirements of the host 13.

Figure 2A:
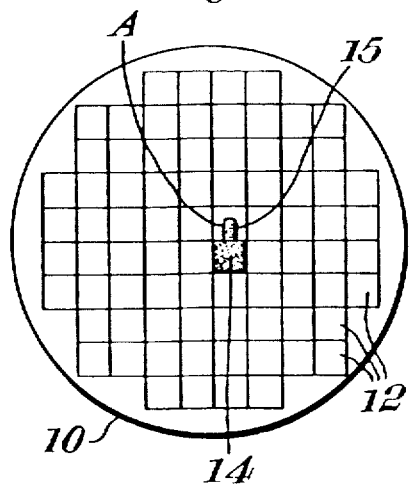
FIGS. 2A to 2H show the growth of intercoupled chains of cells on the wafer.
Figure 2B:
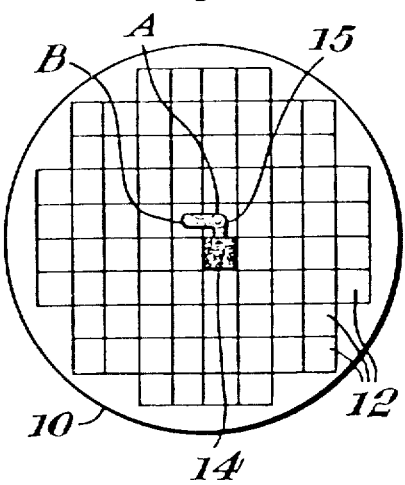
Figure 2C:
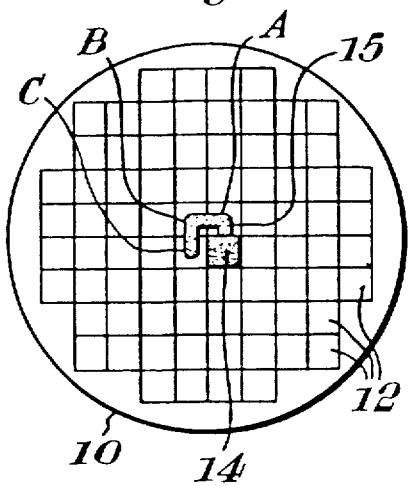
Figure 2D:
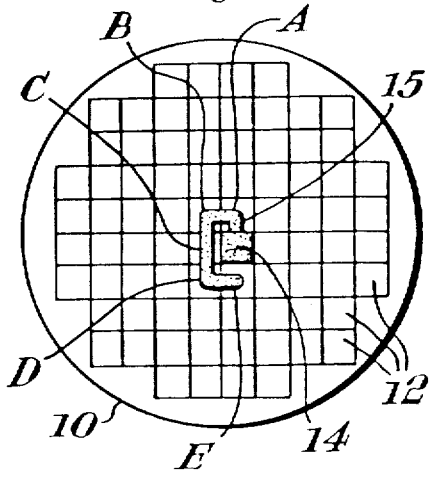
Figure 2E:
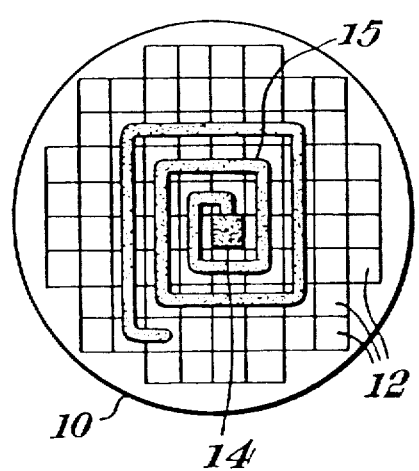
Figure 2F:
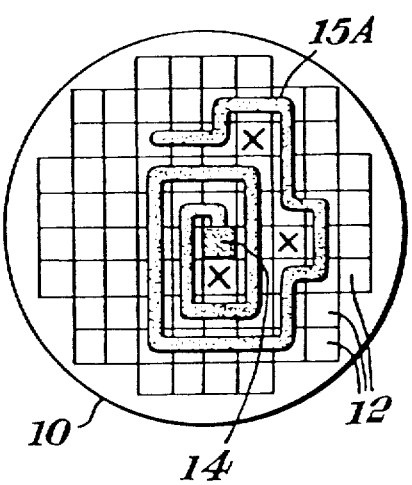
Figure 2G:
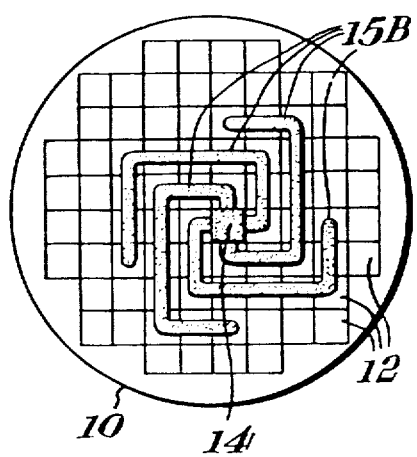

FIG. 2G shows, by way of a second example, how four independent chains 15B may be grown, one from each of the four boundaries of the port 14. The controller 11 may add one cell 12 to each of the four chains 15B in turn so that each chain 15B is of the same length. Alternatively, the controller 11 may be adapted to grow all four chains 15B simultaneously by being operable to provide four simultaneous sets of data and command signals, one to each chain 15B.

Figure 2H:
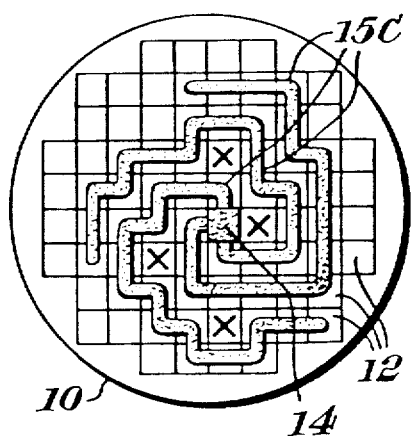

FIG. 2H shows the growth of modified independent chains 15C from the four boundaries of the port 14 on a wafer 10 having non-functional cells X. As in FIG. 2F, non-functional cells X are skirted, and blind alleys may be corrected for by the back tracking of any chain 15C. FIG. 2H also shows the effect of having a non-functional cell X bordering on the port 14. The port 14 is unable to pick up any functional cell 12 in the sourtherly direction, and therefore all growth of a chain initiated to the south of the port 14 is inhibited, resulting in there being only three modified independent chains 15C as opposed to four independent chains 15B in FIG. 2G.

The particular chain growing routine of the controller 11 need not necessarily grow spirals. The controller 11 may be adapted to grow any configuration which picks up a substantial proportion of functional cells 12 on any wafer 10 having non-functional cells thereon. In the event of there being more than one port 14, the chains grown from the boundaries thereof do not link into one another because of the resistance of an already incorporated cell 12 to further incorporation.

Figure 1:
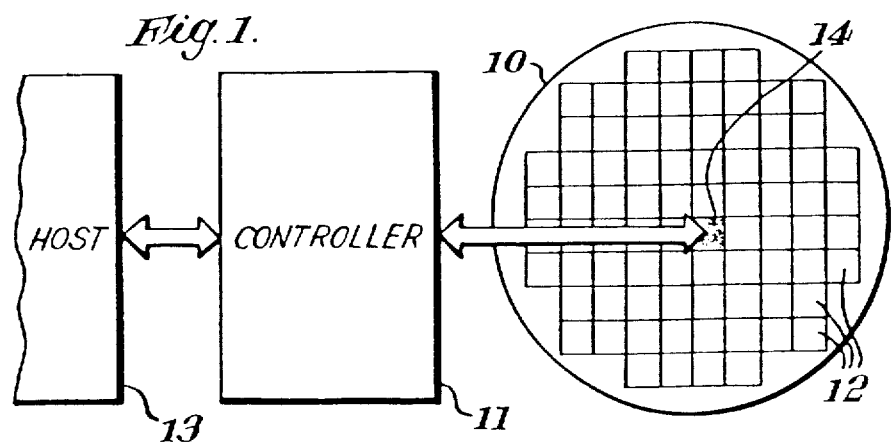
FIG. 1 shows a semiconductor wafer whereon a plurality of cells are coupled, via a controller, to a host.
Figure 3:
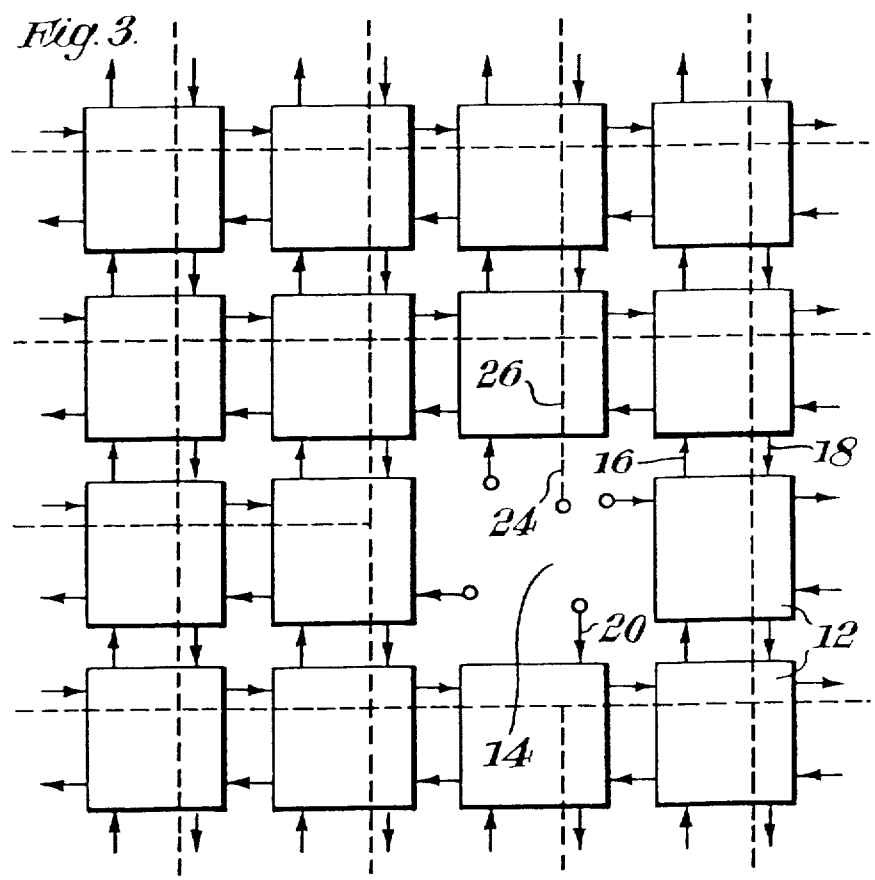
FIG. 3 shows the interconnections between cells.

FIGS. 3 shows details of the intercouplings of the cells 12 on the wafer 10.

Each cell 12 is coupled to its bordering neighbors via an in bus 16 and an out but 18, it being understood that the out bus 18 of one cell is the in bus 18 of the neighbor and the out bus 18 of the neighbor is the in bus 16 on the cell 12. A cell 12 communicates with its neighbor via the out bus 18 when that neighbor is later in a chain 15 than that cell 12. A cell 12 communicates with a neighbor via the in bus 16 when that neighbor preceeds the cell 12 in a chain 15. An out bus 18 and an in bus 16 are never used together on the same boundary of a cell 12. In use, a cell communicates with that neighbor preceeding it in the chain 15 via an in bus 16 on one of its boundaries, and communicates with that neighbor succeeding it in the chain 15 via an out bus 18 on another of its boundaries, so that, at most, there is one in bus 16 and one out bus 18 operational at any one time in any cell 12, and then on different boundaries of the cell 12. Each of the two boundary buses 16,18 comprises three signal lines and are described later.

The coupling port 14 is provided with four coupling buses 20 terminated with pads on which gold-wire bonding, well known in the art, is used to provide connection firstly to the outside world and thereafter to the controller 11. The coupling buses 20 correspond in every way to the out buses 18 to each cell. One coupling bus 20 is provided for each cell 12 bordering onto the port 14. The bordering cells 12 are not provided with out buses 16 to the controller 11 as the controller 11 is always first in a chain 15 and it would therefore be inappropriate to provide coupling means used by the bordering cells 12 to communicate with the controller 11 as if it were later in a chain 15 than themselves.

The port is also provided with a set of pads for gold-wire bonding 24 for providing a global bus 26 to every cell 12 on the wafer 10. The global bus provided a regularly repetitive clock signal, a pulsed synchronizing signal, and D.C. power to each cell 12. The global bus 26, shown in dotted line, comprising three lines, is carried by a waferwide metallization pattern going to each cell 12 on the wafer 10.

FIG. 4 shows details of the connection to the cells 12.

The four boundaries of the cell 12 are indicated by the points of the compass N,S,E and W. Each in bus 16N, 16S,16E and 16W respectively comprising a DATA IN line 28N, 28S,28E and 28W respectively, for carrying data to be stored and command signals into the cell, a VALID IN line 30N,30S,30E and 30W respectively for carrying the initiating signal into the cell 12 from a neighbor, and a REPLY OUT line 32N,32S,32E and 32W respectively for carrying data, retrieved from storage in the cell 12 back down the chain 15 to the controller 11. Each out bus 18N,18S,18E and 18W respectively comprises a REPLY IN line 34N,34S,34E and 34W respectively for carrying data retrieved from storage in a cell 12 later in the chain 15 than the cell shown, into the cell 12 shown for transmission via the REPLY OUT line 32N,32S,32E or 32W respectively, back down the chain 15 to the controller 11, a VALID OUT LINE 36N,36S,36E and 36W respectively for providing the initiating signal to a neighboring cell 12, and data out line 38N,38S,38E and 38W respectively for transferring data and command signals to a neighbouring cell 12 later in the chain 15 than the cell 12 shown.

The global bus 26 comprises a power line 40 for providing D.C. power to the cell, a CLOCK line 42 for providing a CLOCK signal to the cell 12, and a SYNCH line 44 for providing a synchronizing signal to the cell 12.

The power line 40 is coupled to the cell 12 via a fusible link designed to melt and become open circuit should the cell 12 draw excessive current, thus cutting off power to the cell 12. In this way, a cell 12 that has an electrical fault therein such as a short circuit of the power supply by losing its power supply by the melting of the fusible link does not drag down the power supply voltage to other cells 12 and therefore permits them to continue to function. A disconnected cell 12 will not pass the functional test and the controller 11 will ignore it.

The CLOCK line 42 carries a regularly repetitive logical CLOCK signal which continuously cycles between logically true and logically false. The CLOCK signal is used to shift data and command signals along shift registers in the cell, one shift being accomplished every clock period.

The SYNCH signal on the SYNCH line 44 is a pulsed signal for designating the boundaries of certain epochs in the shifting of data and command signals in the cells 12. The pulsed raising of the SYNCH signal from logically false to logically true is used to indicate that a complete command string might have been loaded via the DATA IN line 28N,28S,28E or 28W. The detailed description of this action is given at a later stage.

FIG. 5 shows details of the internal members of the cell 12.

The cell 12 comprises input logic 46 mutually coupled to a memory module 48 which in turn is mutually coupled to output logic 50.

The input logic 46 receives the DATA IN lines 28N,28S,28E and 28W and selectively couples one of them to the COMMON DATA IN line 280 going to the memory module 48. The input logic 46 also receives a COMMON REPLY OUT line 320 from the memory module 48 and couples it to a selected one of the REPLY OUT lines 32N,32S,32E and 32W. The selection process is governed by the VALID IN lines 30N,30S,30E and 30W which the input logic 46 receives and the logical state of which it responds to.

The input logic 46 comprises a five state asynchronous logic state machine which moves between states in response to the VALID IN signals and which generates output in each state effective to control the selection of the particular DATA IN line 28N,28S,28E or 28W which is to be coupled to the COMMON DATA IN line 280 and the selection of the particular REPLY OUT line 32N, 32S, 32E or 32W to which the COMMON REPLY OUT line 320 is to be coupled. The purpose of the state machine is to perform the anti-cross coupling function described earlier whereby a cell 12 resists coupling to and being test from more than one direction at once, and abandons any coupling to any neighbor when no initiating signal, i.e. no VALID signal is received from any direction.

TABLE 4 gives listing of definitions and acronyms used hereafter in the description of the state machine.

TABLE 1

| DEFINITIONS AND ACRONYMS |
| --- |
| 1 = Logically true |
| 0 = Logically false |
| X = A line to which no signal is coupled |
| IVN = Incoming VALID signal from North on 30N |
| IVS = Incoming VALID signal from South on 30S |
| IVE = Incoming VALID signal from East on 30E |
| IVW = Incoming VALID signal from West on 30W |
| IDN = Incoming DATA signal from North on 28N |
| IDS = Incoming DATA signal from South on 28S |
| IDE = Incoming DATA signal from East on 28E |
| IDW = Incoming DATA signal from West on 28W |
| ORN = Outgoing REPLY signal to North on 32N |
| ORS = Outgoing REPLY signal to South on 32S |
| ORE = Outgoing REPLY signal to East on 32E |
| ORW = Outgoing REPLY signal to West on 32W |
| CDI = Common DATA IN signal on 280 |
| CRO = Common REPLY OUT signal on 320 |

Figure 6:
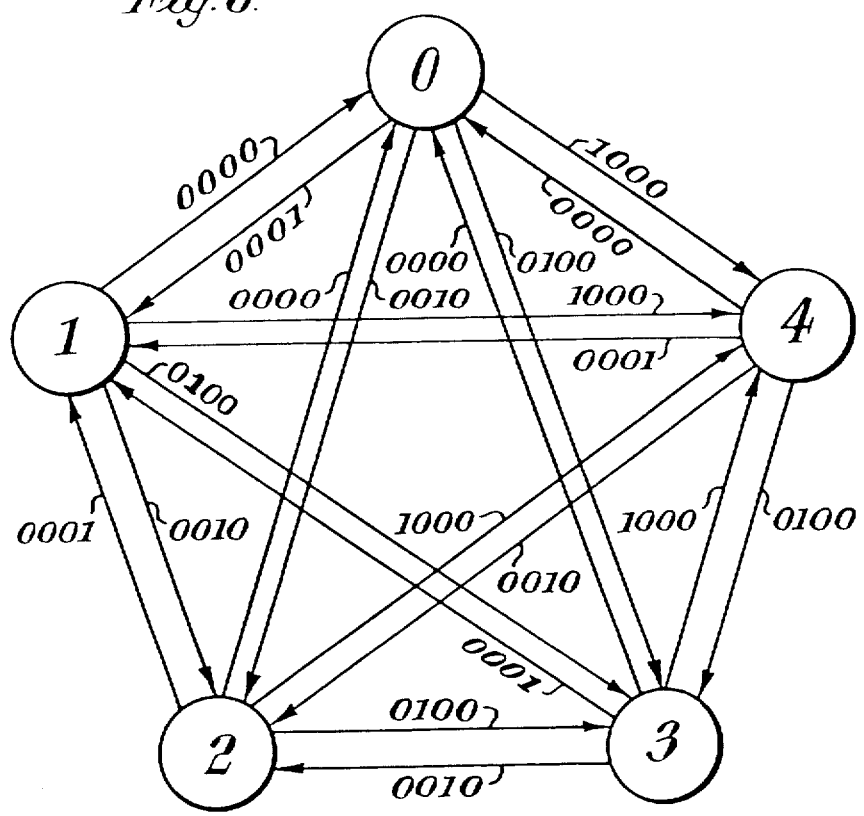
FIG. 6 shows, in a state diagram,, the anti cross coupling function of the input logic of FIG. 5.

The input logic 46 has a state determined only by the VALID signals IVN,IVS,IVE and IVW. A state is entered only either when one of these signals is true and the others false, or when none of these signals is true. The action of the state machine is shown in the state diagram of FIG. 6, where the four digit characters associated with each transition correspond to the required logical state of the VALID IN signals IVN,IVS,IVE,IVW in that order. When in any one of states 1 to 5 the input logic 46 couples the COMMON REPLY OUT line 320 and the COMMON DATA IN line 280 to a selected one of the REPLY OUT lines 28 and a selected one of the DATA IN lines respectively, the selected lines 28,32 both being on the same boundary N,S,E or W of the cell 12. When in state 0 no coupling to the memory module 48 occurs. Table 2 summarizes the state transitions of the input logic 46.

TABLE 2

| | STATE TRANSITIONS OF INPUT LOGIC 46 | | | | | | | | |
| --- | --- | --- | --- | --- | --- | --- | --- | --- | --- |
| | ENTRY CONDITION | | | | EXIT CONDITION | | | | DESTINATION |
| STATE | IVN | IVS | IVE | IVW | IVN | IVS | IVE | IVW | STATE |
| 0 | 0 | 0 | 0 | 0 | 0 | 0 | 0 | 1 | 1 |
| | | | | | 0 | 0 | 1 | 0 | 2 |
| | | | | | 0 | 1 | 0 | 0 | 3 |
| | | | | | 1 | 0 | 0 | 0 | 4 |
| 1 | 0 | 0 | 0 | 1 | 0 | 0 | 0 | 0 | 0 |
| | | | | | 0 | 0 | 1 | 0 | 2 |
| | | | | | 0 | 1 | 0 | 0 | 3 |
| | | | | | 1 | 0 | 0 | 0 | 4 |
| 2 | 0 | 0 | 1 | 0 | 0 | 0 | 0 | 0 | 0 |
| | | | | | 0 | 0 | 0 | 1 | 1 |
| | | | | | 0 | 1 | 0 | 0 | 3 |

TABLE 2-continued

| | STATE TRANSITIONS OF INPUT LOGIC 46 | | | | | | | | |
|---|---|---|---|---|---|---|---|---|---|
| | ENTRY CONDITION | | | | EXIT CONDITION | | | | DESTINATION |
| STATE | IVN | IVS | IVE | IVW | IVN | IVS | IVE | IVW | STATE |
| | | | | | 1 | 0 | 0 | 0 | 4 |
| 3 | 0 | 1 | 0 | 0 | 0 | 0 | 0 | 0 | 0 |
| | | | | | 0 | 0 | 0 | 1 | 1 |
| | | | | | 0 | 0 | 1 | 0 | 2 |
| | | | | | 1 | 0 | 0 | 0 | 4 |
| 4 | 1 | 0 | 0 | 0 | 0 | 0 | 0 | 0 | 0 |
| | | | | | 0 | 0 | 0 | 1 | 1 |
| | | | | | 0 | 0 | 1 | 0 | 2 |
| | | | | | 0 | 1 | 0 | 0 | 3 |

Table 3 shows the coupling function of the input logic 46 in each of its states.

TABLE 3

| COUPLING FUNCTION OF INPUT LOGIC 46 | | | | | |
|---|---|---|---|---|---|
| STATE | CDI | ORN | ORS | ORE | ORW |
| 0 | X | X | X | X | X |
| 1 | IDW | X | X | X | CRO |
| 2 | IDE | X | X | CRO | X |
| 3 | IDS | X | CRO | X | X |
| 4 | IDN | CRO | X | X | X |

The input logic 46, in receiving a unique VALID IN signal from a particular direction, couples the REPLY OUT line 32 in that direction to the common reply line 320 and couples the DATA IN line 28 from that direction to the common data in line 280.

The memory module 48 is operable to decode instructions, incoming on the common data in line 280 from the controller 11 and pass on those decoded instructions, where appropriate, to control the output logic 50. The module 48 is also operable to store data, when commanded, coming in from the controller 11 on the common data line 280 and, when commanded, retrieve data and send it out to the controller 11 on the common reply out line 320. In addition, the module 48 transfers signals received on the common reply in line 340 being data retrieved from storage in cells 12 later in the chain 15, to the common reply out line 320, and transfers, via a shift register, data instructions arriving on the common data in line 280 being destined for cells 12 later in the chain 15 to the common data out line 380. The precise operation of the module 48 is described later.

The output logic 50 controls the coupling to the cell 12 later in the chain 15 than the cell 12 shown. The output logic 50 provides an outgoing VALID line in each direction 36N,36S,36E and 36W, which lines activate the input logic 46 of whichever cell 12 is designated, by the controller 11 as being later in the chain than the cell shown. The memory module 48 decodes an instruction from the controller 11 and provides the output logic 50 with a signal on the OPEN NORTH line 52, the OPEN SOUTH line 54, the OPEN EAST line 56 or on the OPEN WEST line 58 to which the output logic responds by raising the signal on the VALID OUT North line 36N, the VALID OUT South line 36S, the VALID OUT East line 36E or the VALID OUT West line 36W respectively.

The output logic is responsive to which of the OPEN lines 52,54,56,58 is activated to steer the signals from the COMMON DATA OUT line 380 onto one of the DATA OUT lines 38N,38S,38E or 38W, and similarly responds to steer the signals appearing on the REPLY IN lines 34N,34S,34E or 34W to the COMMON REPLY IN line 340.

The memory module 48 also sends an END LOOP instruction to the output logic 50, again decoded from instructions from the controller 11, in response whereto the output logic 50 drops the signal to all of the VALID OUT lines 36N,36S,36E or 36W.

The output logic 50 has latches which latch the input signals on the OPEN lines 52,54,56,58 in response to the VALID OUT LATCH line 360, from the memory module 48, in a manner explained later, to become the VALID OUT signals. The END LOOP instruction has the effect of resetting the latches.

The output logic 50 does not allow more than one VALID OUT line to be raised at a time. Whichever of the VALID OUT lines 36N,36S,36E or 36W is raised, then the output logic 50 receives the REPLY IN line 34N,34S,34E or 34W respectively, from that direction, and couples the COMMON DATA OUT line 380 to the DATA OUT line 38N,38S,38E or 38W respectively, in that same direction. Tables 4,5 and 6 summarize the action of the output logic 50.

TABLE 4

ACTION OF THE OUTPUT LOGIC 50
DEFINITIONS AND ACRONYMS IN TABLES 5 & 6

1 = Logically true
0 = Logically false
X = A line to which no signal is supplied
VON = VALID OUT signal to North on 36N
VOS = VALID OUT signal to South on 36S
VOE = VALID OUT signal to East on 36E
VOW = VALID OUT signal to West on 36W
ON = OPEN NORTH signal on 52
OS = OPEN SOUTH signal on 54
OE = OPEN EAST signal on 56
OW = OPEN WEST signal on 58
EL = END LOOP instruction on 60
DON = DATA OUT signal to North on 38N
DOS = DATA OUT signal to South on 38S
DOE = DATA OUT signal to East on 38E
DOW = DATA OUT signal to West on 38W
RIN = REPLY IN signal from North on 34N
RIS = REPLY IN signal from South on 34S
RIE = REPLY IN signal from East on 36E
RIW = REPLY IN signal from West on 36W
CDO = COMMON DATA OUT signal on 380
CRI = COMMON REPLY IN signal on 340
SYNCH = Pulsed synchronising signal on SYNCH LINE 44
VOLL = Signal on VALID OUT LATCH line 360 generated by the memory module 48

TABLE 5

ACTION OF THE OUTPUT LOGIC 50 COUPLING FUNCTION (EL = 0)

| ON | OS | OE | OW | SYNCH LATCH | VON | VOS | VOE | | VOW |
|----|----|----|----|-------------|-----|-----|-----|---|-----|
|    |    |    |    | →           |     |     |     |   | EL = 1 |
| 0  | 0  | 0  | 1  |             | 0   | 0   | 0   | 1 | → |
| 0  | 0  | 1  | 0  |             | 0   | 0   | 1   | 0 | RESETS LATCHES |
| 0  | 1  | 0  | 0  |             | 0   | 1   | 0   | 0 | and therefore |
| 1  | 0  | 0  | 0  |             | 1   | 0   | 0   | 0 | sets all VALID OUT lines to i.e. VON=VOS=VOE=VOW=0 |

NB. The input state where more than one OPEN line is true is forbidden by the action of an instruction decoder in the memory module 48 whose output, when decoding instructions from the controller, may have only one output true at a time. This is explained in the folowing text. The memory module 48 generates VOLL according to
VOLL = (ON+OS+OE+OW). SYNCH

TABLE 6

ACTION OF THE COUPLING LOGIC 50 SIGNAL SWITCHING FUNCTION

| VON | VOS | VOE | VOW | CRI | DON | DOS | DOE | DOW |
|-----|-----|-----|-----|-----|-----|-----|-----|-----|
| 0   | 0   | 0   | 0   | X   | X   | X   | X   | X   |
| 0   | 0   | 0   | 1   | RIW | X   | X   | X   | CDO |
| 0   | 0   | 1   | 0   | RIE | X   | X   | CDO | X   |
| 0   | 1   | 0   | 0   | RIS | X   | CDO | X   | X   |
| 1   | 0   | 0   | 0   | RIN | CDO | X   | X   | X   |

FIG. 7 shows in schematic form, the internal structure and connections of the memory module 48.

The common data in line 280 is provided as the input to a serial 1 bit adder 62 which is enabled by the SYNCH pulse on the SYNCH line 44 and disabled when the signal on a disabling line 64 is logically true. When enabled by the SYNCH pulse, the adder 62 increments the incoming word on the COMMON DATA IN line 280 by 1 just once. When the signal on the disabling line 64 is logically true, the adder 62 does not operate even though it is enabled by the SYNCH pulse, and passes on its input signal unchanged to its output.

The output of the adder 62 is provided as the input to a 15 bit shift register 66 which accepts the input and shifts the incoming word by one place along its length for every cycle of the CLOCK signal on the CLOCK line 42.

The output of the shift register 66 is provided as the input to a serial 1 bit subtractor 68 which is enabled by the SYNCH pulse on the SYNCH line 44 to subtract 1 from the output of the shift register 66 and provide the decremented word as an output.

The output of the subtractor 68 is provided as the controlled input to a signal gate 69 which provided as its output, its input signal whenever the signal on a controlling input line 70 is logically false and provided no output whenever the signal on the controlling input line 70 is logically true.

The output of the gate 69 is provided on the COMMON DATA OUT line 380.

The first nine bit storage positions of the shift register 66 are provided as the input to a 9 bit latch 72. The latch 72 is clocked by the SYNCH signal on the SYNCH line 44. When clocked, the latch 72 presents, as its output, the logical states of its inputs.

The last six bit storage positions of the shift register 66 are provided as the input to an all zeros detector 74 which provides a logically true output if and only if all six of its inputs are logically false.

The output of the zeros detector 74 is provided as the data input to a 1 bit latch 76 which is clocked by the SYNCH signal on the SYNCH line 44. The output of the 1 bit latch 76 is logically true if and only if the data stored in the last six bit storage positions of the shift register 66 in all zeros (logically false) at the instant that the SYNCH pulse is applied.

The first three bits of the output of the latch 72 are provided as the input to a command decoder 78. The decoder is enabled only when the output of the 1 bit latch 76 is logically true, that is, when the last 6 bits stored in the shift register 66 are all zero at the time of application of the SYNCH pulse. The decoder 78 accepts the three binary digit input and in response, when enabled, responds to its input by making a selected one of eight outputs logically true. Each of the eight outputs is indicative of a particular instruction to be executed by the memory module 48.

The next six bits provided as the output of the latch 72 are provided as the input to a loop address decoder 80. The address decoder 80 is also enabled only when the output of the 1 bit latch 76 is logically true, that is, when the last 6 bits stored in the shift register 66 were logically true when the most recent SYNCH pulse was applied.

The address decoder 80 has 64 output lines, one for each of the 64 different binary numbers which may be presented as its input. In response to each binary number so presented, the address decoder 80 causes just one output, the particular output being determined by the particular binary number, to be logically true.

The 64 outputs of the address decoder 80 are provided as inputs to storage loop control logic 82 which is effective to control the data deposition into and retrieval from 64 shift register data storage loops 84. Each of the outputs of the address decoder 80 corresponds to an instruction to the loop control logic 82 to use a selected one of the data storage loops 84.

The loop control logic 82 receives data to be stored in the loops 84 via the COMMON DATA IN line 280, and provides data retrieved from the loops 84 on the COMMON REPLY OUT line 320 via a first OR gate 86 which "ORs" the data retrieved from the loops 84 with the signal coming in on the COMMON REPLY IN line 340. The loop control logic 82 also receives the CLOCK signal on the CLOCK line 42 and provides it to the storage loops 84 whenever it is required to shift data therein. The length of each of the data storage shift register loops 84 is immaterial to the invention. Stored data is static in the loops 84 unless being accessed.

The command decoder 78 provides two instructions to the loop control logic 82. A first instruction, the READ instruction, causes the data in a selected one of the loops 84 to be read out onto the COMMON REPLY OUT line 320 and be recycled back into the selected loop 84, so providing a non-destructive readout facility. A second instruction, the READ/WRITE instruction causes the data stored in a selected loop 84 to be read out onto the COMMON REPLY OUT line 320 and to be replaced in the selected loop 84 by the signal coming in on the COMMON DATA IN line 280.

The command decoder 78 also provides one of its 8 outputs as each of the OPEN NORTH line 52, the OPEN SOUTH line 54, OPEN EAST line 56 and the OPEN WEST line 58. The decoder 78 provides another of its outputs as the END LOOP line 60. The last of the outputs of the command decoder 78 is provided as the controlling signal on the controlling input line 70 to the gate 69. This last output is activated, i.e. made logically true whenever a DO NOTHING instruction is to be obeyed. The DO NOTHING instruction ensures that all zeros are passed on to the succeeding cell 12 in the chain.

The signal on the VALID OUT LATCH line 360, used by the logic output 50 to latch the states of the OPEN lines 52,54,56,58 as the outputs of the VALID OUT lines 36N,36S,36E or 36W is generated by a second OR gate 88 which has as its inputs, the signals on each of the OPEN lines 52,54,56,58 and generates a logically true output signal if any of its inputs is logically true, and by an AND gate 90 which has the output of the second OR gate 88 as a first input and the SYNCH signal on the SYNCH line 44 as a second input, the output of the AND gate 90 being provided as the signal on the VALID OUT LATCH line 360 whenever one of the OPEN lines 52,54,56,58 is logically true at the time when a SYNCH pulse is applied.

Table 7 shows the operation of the command decoder 78, and Table 8 shows the response of the memory module 48 to each of the instructions issued by the command decoder 78.

TABLE 7

| RESPONSE OF COMMAND DECODER 78 | | | | | | | | | | | |
|---|---|---|---|---|---|---|---|---|---|---|---|
| 1 = Logically true | | | | | | | | | | | |
| 0 = Logically false | | | | | | | | | | | |
| E = Output of 1 bit latch 76 | | | | | | | | | | | |
| O1 to O8 = Output signals of decoder 78 | | | | | | | | | | | |
| I1 to I3 = Input number to decoder 78 | | | | | | | | | | | |
| INPUT NUMBER | | | | OUTPUT RESPONSE | | | | | | | |
| E | I1 | I2 | I3 | O1 | O2 | O3 | O4 | O5 | O6 | O7 | O8 | COMMAND NAME |
| 0 | 0 | 0 | 0 | 0 | 0 | 0 | 0 | 0 | 0 | 0 | 0 | NIL |
| 0 | 0 | 0 | 1 | 0 | 0 | 0 | 0 | 0 | 0 | 0 | 0 | NIL |
| 0 | 0 | 1 | 0 | 0 | 0 | 0 | 0 | 0 | 0 | 0 | 0 | NIL |
| 0 | 0 | 1 | 1 | 0 | 0 | 0 | 0 | 0 | 0 | 0 | 0 | NIL |
| 0 | 1 | 0 | 0 | 0 | 0 | 0 | 0 | 0 | 0 | 0 | 0 | NIL |
| 0 | 1 | 0 | 0 | 0 | 0 | 0 | 0 | 0 | 0 | 0 | 0 | NIL |
| 0 | 1 | 1 | 0 | 0 | 0 | 0 | 0 | 0 | 0 | 0 | 0 | NIL |
| 0 | 1 | 1 | 1 | 0 | 0 | 0 | 0 | 0 | 0 | 0 | 0 | NIL |
| 1 | 0 | 0 | 0 | 0 | 0 | 0 | 0 | 0 | 0 | 0 | 1 | NO ACTION |
| 1 | 0 | 0 | 1 | 0 | 0 | 0 | 0 | 0 | 0 | 1 | 0 | END LOOP |
| 1 | 0 | 1 | 0 | 0 | 0 | 0 | 0 | 0 | 1 | 0 | 0 | READ |
| 1 | 0 | 1 | 1 | 0 | 0 | 0 | 0 | 1 | 0 | 0 | 0 | READ/WRITE |
| 1 | 1 | 0 | 0 | 0 | 0 | 0 | 1 | 0 | 0 | 0 | 0 | OPEN NORTH |
| 1 | 1 | 0 | 1 | 0 | 0 | 1 | 0 | 0 | 0 | 0 | 0 | OPEN SOUTH |
| 1 | 1 | 1 | 0 | 0 | 1 | 0 | 0 | 0 | 0 | 0 | 0 | OPEN EAST |
| 1 | 1 | 1 | 1 | 1 | 0 | 0 | 0 | 0 | 0 | 0 | 0 | OPEN WEST |

TABLE 8

| DESCRIPTION OF ACTION TAKEN ON RECEIPT OF EACH COMMAND OF TABLE | |
|---|---|
| COMMAND NAME | RESPONSE OF MEMORY MODULE 48 |
| DO NOTHING | PASS ALL ZEROS TO NEXT CELL 12 IN CHAIN 15 VIA COMMON DATA OUT LINE 380 |
| READ | RETRIEVE DATA STORED IN STORAGE LOOP 84 ADDRESSED BY ADDRESS DECODER 80, PROVIDING RETRIEVED DATA ON COMMON DATA OUT LINE 320 AND CYCLING DATA BACK INTO ADDRESSED LOOP 84. |
| READ/WRITE | RETRIEVE DATA STORED IN STORAGE LOOP 84 ADDRESSED BY ADDRESS DECODER 80, PROVIDING RETRIEVED DATA ON COMMON DATA OUT LINE 320 AND REPLACING RETRIEVED DATA WITH DATA COMING IN ON COMMON DATA IN LINE 280 |
| END LOOP | RESET ALL LATCHED VALID OUT SIGNALS TO NEXT CELL 12 IN CHAIN 15 TO ZERO SUCH THAT VON = VOS = VOE = VOW = 0 |
| OPEN NORTH | RAISE THE SIGNAL ON THE OPEN NORTH LINE 52 |

TABLE 8-continued

| DESCRIPTION OF ACTION TAKEN ON RECEIPT OF EACH COMMAND OF TABLE | |
|---|---|
| COMMAND NAME | RESPONSE OF MEMORY MODULE 48 |
| OPEN SOUTH | TO BECOME LOGICALLY TRUE AND LATCH THIS CONDITION TO THE VALID OUT LINES 36M, 36S 36E and 36W such that VOW = 1 AND VOS = VOE = VOW = O RAISE THE SIGNAL ON THE OPEN SOUTH LINE 54 TO BECOME LOGICALLY TRUE AND LATCH THIS CONDITION TO THE VALID OUT LINES 36N, 36S, 36E AND 36W such that VOS = 1 AND VON = VOE = VOW = 0 |
| OPEN EAST | RAISE THE SIGNAL ON THE OPEN EAST LINE 56 TO BECOME LOGICALLY TRUE AND LATCH THIS CONDITION TO THE VALID OUT LINES 36N, 36S, 36E AND 36W SUCH THAT VOE = 1 AND VON = VOS = VOW = 0 |
| OPEN WEST | RAISE THE SIGNAL ON THE OPEN WEST LINE 58 TO BECOME LOGICALLY TRUE AND LATCH THIS CONDITION TO THE VALID OUT LINES 36N, 36S, 36E AND 36W SUCH THAT VOW = 1 AND VON = VOS = VOE = 0 |

FIG. 8 shows a portion of a chain 15 stretched out into a topologically equivalent straight line.

The coupling port 14 connects, as part of the coupling bus 20, a data and command line 38$^I$ from the controller 11 to the data in line 28 of the first cell 12$^I$, and also connects a reply line 34$^I$ to the controller 11, to the reply out line 32 of the first cell 12$^I$. Thereafter the data out line 38 of each cell 12 is connected to the data in line 28 of the succeeding cell 12 in the chain 15, and the reply out line 32 of each cell 12 is coupled to the reply in line 34 of each cell 12 preceeding it in the chain 15. The global bus 26 provides the SYNCH line 44 to each cell 12.

The effect of this coupling is to couple the shift register 66 in each cell 12 in series with the shift registers 66 in the other cells.

FIG. 9 shows an example of the command and data stream which the controller 11 couples into the chain of shift registers 66 and the corresponding SYNCH pulses which the controller 11 issues.

The command and data stream 91 comprises data words 92,98 for storage in the loops 84 of the memory module 48, dummy command words 94 for inhibiting the action of the serial 1 bit adder 62, and actual command words 96 to which a predetermined cell 12 in the chain responds either by altering its inter-cell coupling or by storing and/or retrieving data in the loops 84.

The dummy command word 94 always preceeds an actual command word 96. The dummy command word 94 consists of a stream of all zeros as long as the command word 96 itself. The command word 96 and the dummy command word 94 are each the same length as the shift register 66, in this case 15 bits long.

The data word 98 is as long as each one of the 64 data storage loops 84. Each data word 98,94 is of sufficient size to exactly fill one of the loops 84.

The controller 11, in sending a command word 96 to a particular cell 12 in the chain 15, issues a stream 100 of SYNCH pulses 102 to impart to each cell 12 the information that an integral number of shift register 66 length words have been passed into the chain 15.

The controller 11 decides for itself during the chain 15 growth phase, or is commanded by the host 13 during the later phase of using the chain as a memory, to send a command to a particular cell 12. During the growth phase the command would be sent to the end cell 12 in the chain 15 to command it to test in a new direction or to the penultimate cell in the chain 15 to command it to disconnect from the end cell 12 when back tracking, as described earlier. During the phase where the chain 15 is used as a memory, the controller 11 sends commands to any of the cells 12 in the chain 15.

The cells are numbered, by the controller, by unit increment, starting at zero for the first cell 12 along the chain 15. In FIG. 8, and in the description hereafter, the position of a cell 12 in the chain 14 is indicated by a Roman numeric superpostscript.

FIG. 10 shows the structure of the command word 96 as it would be seen after having been loaded into the shift register 66 with the first serial bit received by the cell 12 being to the right. The command word 96 comprises a 6 bit cell address 106, followed by a 6 bit loop address 108 and a 3 bit command code 110. The cell address 106 is scrutinized by the all zeros detector 74, the loop address 108 is scrutinized and passed on to activate a selected one of the data storage loops 84 by the address decoder 80, and the command code 110 is scrutinized by and converted into an action command for the cell 12 by the command decoder 78. The particular activities of these items have been described earlier.

The controller 11 sends a command word 96 to a particular cell 12 in the chain 15 by a combination of providing that command word with a relevant cell address 106 and issuing a relevant number of SYNCH pulses 102 on the SYNCH line.

The controller 11 begins running the dummy command word 94 into the shift register 66 of the first cell 12$^I$. After 15 clock pulses the dummy command word 94 is completely in the shift register 66 of the first cell 12$^I$ and the controller 11 issues a first SYNCH pulse 102. The first SYNCH pulse 102 causes every cell 12 in the chain 15 to respond to the word in its shift register 66. Only those cells 12 with all zeros in the cell address 106 positions respond to any command 96. In the case of the dummy command word 94, which is all zeros, since the all zeros condition includes the cell address 106, the first cell responds. The all zeros command code to which the first cell 12$^I$ responds is the DO NOTHING code, (see tables 7 and 8) so that output from the shift register 66 of the first cell 12$^I$ is inhibited by the closure of the gate 69. Subsequent clock pulses thereafter shift all zeros into the second cell unaffected by the serial 1 bit subtractor 68, which is initiated by the SYNCH pulse 102. In addition, the response of the first cell 12 to the SYNCH pulse disables the serial 1 bit adder 62, so that the following command word 96 is not altered as it enters the first cell 12.

The combined action induced by the all zeros dummy command word 94 of the DO NOTHING response and the inhibition of the adder 62 ensures that any actual command word 96 which follows it remains unincremented by the adder 62 as it passes into each cell 12 in the chain 15, and that the dummy command word 94 itself is propagated unaltered into each cell 12. Even though the serial 1 bit subtractor 68 is activated by the SYNCH pulse 102, the output of the subtractor 68 is prevented from passing into the next cell $12^{II}$ by the gate 69, all zeros being propagated in place of the decremented dummy command word 94, just as if the dummy command word 94 had not been decremented and passed on.

Having shifted the dummy command word 94 into the first cell $12^I$ and issued a SYNCH pulse 102, the controller 11 allows a further 15 clock cycles to pass before issuing a second SYNCH pulse 103.

After the second SYNCH pulse 103 the actual command word is in the shift register 66 of the first cell $12^I$ and the dummy command word 94, or at least a propagated replica thereof, is in the shift register 66 of the second cell $12^{II}$. The second cell $12^{II}$ responds to the dummy command word 94 in just the same way as did the first cell $12^I$. The adder 62 of the second cell $12^{II}$ is inhibited and the second cell $12^{II}$ may propagate only zeros to the third cell $12^{III}$. The actual command word 96, in the shift register 66 of the first cell $12^I$ at the time that a second SYNCH pulse 103 is applied, may or may not cause a response in the first cell $12^I$ dependently upon whether or not the cell address 106 contained therein is all zeros. If the command had been destined for the cell $12^I$, the controller 11 would have provided a cell address 106 of all zeros, and the first cell $12^I$ would have responded to the command code 110. In this example, it is assumed that the command 96 is destined for the third cell $12^{III}$, so that the full action of each cell 12 in the chain 15 may be described, the case of a command 96 being destined for the first cell $12^I$ being a restricted, special case where no serial 1 bit subtractor 68 plays any part.

The command word 96 being in the shift register 66 of the first cell $12^I$, and its cell address 106 not being all zeros, the first cell $12^I$ does not respond to the command code 110, the serial 1 bit adder 62 is enabled, the serial 1 bit subtractor 68 is also enabled, and the output of the subtractor 68 is provided as the input to the second cell $12^{II}$ by virtue of the gate 69 being open since a DO NOTHING command, such as was evoked by the dummy command word 94, is no longer being obeyed.

The controller 11 then allows a further 15 clock cycles to pass before providing a third SYNCH pulse 104 to all cells 12.

At the end of this time the dummy command word 94 has entered the third cell $12^{III}$ unaltered and the third cell $12^{III}$ responds thereto in precisely the same way as did the first cell $12^I$ and the second cell $12^{II}$. The actual command word 96, in passing into the second cell $12^{II}$, is decremented by the serial 1 bit subtractor of the first cell $12^I$ but not incremented by the serial 1 bit adder 62 of the second cell $12^{II}$ which was previously inhibited by the dummy command word 94. The first part of the actual command word 96 to pass into the second cell $12^{II}$ is the cell address 106. The cell address 106 alone is therefore reduced by 1. If the cell address 106, having been decremented, is still not all zeros, as indeed it is not since the command 96 is destined for the third cell $12^{III}$, the second cell $12^{II}$ does not respond to the command code 110.

The first 15 bits of the data word 98 have filled the shift register 66 of the first cell $12^I$. In entering the first cell $12^I$ the data is incremented, i.e. has 1 a added thereto, by the serial 1 bit adder 62, which is not deactivated by the actual command word 96 unless the command 96 is destined for that cell $12^I$. The first cell $12^I$ must not respond to the first 15 bits of the data word 98 as if it were a command word 96. To this end, the data word 98 is a specially coded form of original data either self generated or received from the host 13 such that no serial string of zeros appears therein capable of actuating the all zeros detector 74. In receiving the retrieved data back from the chain 15 the controller passes the retrieved data through an inverse decoder to recover the original data.

Table 9 shows the encoding of original data for storage in the chain 15 and the decoding of data retrieved from the chain 15 back to original form, carried out by the controller 11.

TABLE 9

ENCODING OF ORIGINAL DATA AND DECODING OF RETRIEVED DATA BY CONTROLLER 11

TAKE
TO ENCODE: ORIGINAL DATA IN 5 BIT SEGMENTS AND COVERT TO 6 BIT WORD FOR STORAGE IN CHAIN BY INSERTING A FORCED 1 BETWEEN SECOND AND THIRD BITS OF ORIGINAL DATA SO THAT NO STRING OF ZEROS STORED IN CHAIN IS MORE THAN 5 CONSECUTIVE ZEROS LONG: TO DECODE: EXAMINE RETRIEVED DATA IN 6 BIT LONG SEGMENTS AND MISS OUT THIRD BIT OF EACH SEGMENT.

| ORIGINAL DATA | | | | | | 6 BIT STRING GENERATED FOR OR RETRIEVED FROM STORAGE | | | | | |
|---|---|---|---|---|---|---|---|---|---|---|---|
| 0 | 0 | 0 | 0 | 0 | | 0 | 0 | 1 | 0 | 0 | 0 |
| 0 | 0 | 0 | 0 | 1 | | 0 | 0 | 1 | 0 | 0 | 1 |
| 0 | 0 | 0 | 1 | 0 | | 0 | 0 | 1 | 0 | 1 | 0 |
| 0 | 0 | 0 | 1 | 1 | | 0 | 0 | 1 | 0 | 1 | 1 |
| 0 | 0 | 1 | 0 | 0 | | 0 | 0 | 1 | 1 | 0 | 0 |
| 0 | 0 | 1 | 0 | 1 | | 0 | 0 | 1 | 1 | 0 | 1 |
| 0 | 0 | 1 | 1 | 0 | | 0 | 0 | 1 | 1 | 1 | 0 |
| 0 | 0 | 1 | 1 | 1 | | 0 | 0 | 1 | 1 | 1 | 1 |
| 0 | 1 | 0 | 0 | 0 | | 0 | 1 | 1 | 0 | 0 | 0 |
| 0 | 1 | 0 | 0 | 1 | | 0 | 1 | 1 | 0 | 0 | 1 |
| 0 | 1 | 0 | 1 | 0 | | 0 | 1 | 1 | 0 | 1 | 0 |
| 0 | 1 | 0 | 1 | 1 | | 0 | 1 | 1 | 0 | 1 | 1 |
| 0 | 1 | 1 | 0 | 0 | | 0 | 1 | 1 | 1 | 0 | 0 |
| 0 | 1 | 1 | 0 | 1 | | 0 | 1 | 1 | 1 | 0 | 1 |
| 0 | 1 | 1 | 1 | 0 | | 0 | 1 | 1 | 1 | 1 | 0 |
| 0 | 1 | 1 | 1 | 1 | | 0 | 1 | 1 | 1 | 1 | 1 |
| 1 | 0 | 0 | 0 | 0 | | 1 | 0 | 1 | 0 | 0 | 0 |
| 1 | 0 | 0 | 0 | 1 | | 1 | 0 | 1 | 0 | 0 | 1 |
| 1 | 0 | 0 | 1 | 0 | | 1 | 0 | 1 | 0 | 1 | 0 |
| 1 | 0 | 0 | 1 | 1 | | 1 | 0 | 1 | 0 | 1 | 1 |
| 1 | 0 | 1 | 0 | 0 | | 1 | 0 | 1 | 1 | 0 | 0 |
| 1 | 0 | 1 | 0 | 1 | | 1 | 0 | 1 | 1 | 0 | 1 |
| 1 | 0 | 1 | 1 | 0 | | 1 | 0 | 1 | 1 | 1 | 0 |
| 1 | 0 | 1 | 1 | 1 | | 1 | 0 | 1 | 1 | 1 | 1 |
| 1 | 1 | 0 | 0 | 0 | | 1 | 1 | 1 | 0 | 0 | 0 |
| 1 | 1 | 0 | 0 | 1 | | 1 | 1 | 1 | 0 | 0 | 1 |
| 1 | 1 | 0 | 1 | 0 | | 1 | 1 | 1 | 0 | 1 | 0 |
| 1 | 1 | 0 | 1 | 1 | | 1 | 1 | 1 | 0 | 1 | 1 |
| 1 | 1 | 1 | 0 | 0 | | 1 | 1 | 1 | 1 | 0 | 0 |
| 1 | 1 | 1 | 0 | 1 | | 1 | 1 | 1 | 1 | 0 | 1 |
| 1 | 1 | 1 | 1 | 0 | | 1 | 1 | 1 | 1 | 1 | 0 |
| 1 | 1 | 1 | 1 | 1 | | 1 | 1 | 1 | 1 | 1 | 1 |

WHEN PRESENTING DATA FOR STORAGE, SUBTRACT 1 FROM DATA WORD AS TO COMPENSATE FOR ACTION OF ADDER 62 IN FIRST CELL $12^I$ WHEN RETRIEVING DATA FROM STORAGE, ADD 1 THERETO TO COMPENSATE FOR ACTION OF SUBTRACTOR IN CELL 12 BEFORE CELL WHERE DATA WAS STORED.

It is seen from Table 9 that no two consecutive, encoded 6 bit strings, if placed together, will produce a sequence of consecutive zeros more than 5 zeros long. The all zeros detector 74 being 6 bits long, is thus incapable of being activated by the data 98. Other codes could of course be employed provided they fulfil the criterion that no allowable consecutive string of stored zeros equals the length of the cell address 106.

After the dummy command word 94 has filled the shift register 66 in the third cell 12$^{III}$, the controller 11 allows yet another 15 clock cycles to elapse before issuing a fourth SYNCH pulse 105 placing the dummy command word 94 into the shift register 66 of the fourth cell 12$^{IV}$.

The first 15 bits of the data 98 pass, via the 1 bit subtractor 68, and the gate 70, of the first cell 12$^I$ into the shift register 66 of the second cell 12$^{II}$ and the second fifteen bits of the data 98 pass into the shift register 66 of the first cell 12$^I$. The 1 bit subtractor 68 of the first cell 12$^I$ decrements the first 15 bits of the data 98 so removing the 1 which was previously added by its serial 1 bit adder 62. In a similar manner, the second 15 bits of the data 98 are incremented by the serial 1 bit adder 62 of the first cell 12$^I$. The command word 96 passes into the shift register 66 of the third cell 12$^{IV}$ and, in entering therein, its cell address is decremented by 1 by the serial 1 bit subtractor 68 of the second cell 12$^{II}$.

The controller 11, in sending a command word 96 to the third cell 12$^{IV}$, gives that command word an original cell address 106 of 2. The cell address 106 is decremented when passing out of the first cell 12$^I$ and when passing out of the second cell 12$^{II}$, so that when it is in the third cell 12$^{IV}$ it has been reduced to zero. The cell address 106 being reduced to zero, the all zeros detector 74 responds thereto and activates the third cell 12$^{III}$ to respond to the command code 110. Had the controller wished to send a command to the fourth cell 12$^{IV}$ in the chain 15 it would have given it a cell address of 3. In general, if the controller 11 wishes to send a command word 96 to the Nth cell 12 in the chain 15 it gives it an initial cell address of (N−1).

The third cell 12$^{III}$ responds to the command code 110 according to Tables 7 and 8. In the following clock cycles, in this example, the loop control logic 82 shifts the stored data in one of the storage loops 84 selected by the loop address 108, providing retrieved data on the REPLY OUT line 32 if told READ or READ/WRITE and storing incoming data 98 in the selected loop if told to READ/WRITE. The READ/WRITE command is the only command whereby data 98 may be placed in a storage loop 84. Recovered data, passing out of the REPLY OUT line 32 of the third cell 12$^{III}$ and into the REPLY IN line 34 of the second cell 12$^{II}$, passes, via the OR gates 86 of the second and first cells 12$^{II}$, 12$^I$, direct to the controller 11.

The data word 98, in passing out of the second cell 12$^{II}$ into storage in the third cell 12$^{III}$, is decremented by the serial 1 bit subtractor 68 of the second cell 12$^{II}$, but bypasses the serial 1 bit adder of the third cell 12$^{III}$. The data stored in the loops 84 is therefore not identical to the data generated by the code of Table 9 bus is 1 less than the entire data word 98 generated by the serial presentation of the 6 bit long strings generated by the conversion of Table 9. In recovering data 98 from the loops 84 the controller 11 therefore adds 1 to the entire retrieved data word so that it may be properly split into 6 bit long segments for reconversion, according to Table 9, back to original data.

The controller 11 does not issue a further SYNCH pulse 107 until all of the data word 98 has been inserted into the third cell 12$^{III}$. The further SYNCH pulse 107 closes the third cell 12$^{III}$. Thereafter another instruction may be started up the chain 15, preceded by its dummy command word 94, and destined for any other cell 12.

It will be appreciated that the data word 98 may have a maximum length equal to that of each of the storage loops 84. The data word 98 need not be as long as this. Parts of stored records in the loops 84 may be read or exchanged.

During the growth phase the controller 11 issues consecutive commands 96 to the end cells 12 of the chain 15, for example, an OPEN instruction to the current end cell 12 commanding it to raise one of its VALID OUT lines 36N,36S,36E or 36W to a neighbor, followed by an instruction to the newly coupled neighbor to store a data word in one of its loops 84 for later retrieval as a test of data integrity. There is no objection to having one command word 96 followed by another down the chain 15, provided the controller 11 issues SYNCH pulses appropriately and provided each command word 96 is preceded by a dummy command word 94. As many dummy words 94 as is desired may be strung together consecutively without affecting the operation of the chain, though only one preceding each actual command word 96 is strictly necessary.

During the growth phase the controller 11 need not reject a cell 12 simply because one or more of its plurality of data storage loops is not functional. The controller 11 can keep a record of which loops 84 in which cell 12 are functional and store and retrieve data words accordingly. Similarly, a cell where very few or none of the loops 84 is functional might be used, provided it is capable of transferring data in and out of its shift register 66, to provide a bridge to other, functional cells 12 on the wafer 10.

In the particular example of the preferred embodiment, the cell 12 shown has 64 data storage loops 84 and 8 instructions. These particular numbers are purely a matter of choice, more or fewer loops being possible, as well as more instructions, the length of the shift register 66 being adjusted to accommodate the altered requirement, as are the command decoder 78 and the loop address decoder 80.

The maximum number of addressable cells 12 in the case of the preferred embodiment is limited, by the 6 bit length of the cell address 106 and the corresponding all zeros detector 75 to a maximum of 64, which number is purely a matter of choice, given for example only, and may be altered to accommodate different sizes of wafer 10 and/or cells 12.

It is to be appreciated that in general when such a cell 12 is to be used for memory storage purposes the loops 84 need not necessarily be of the same length. In more general applications the loops 84 may be replaced by other data processing elements. It is further to be appreciated that the loops 84 or the data processing elements which replace them need not all be of the same kind together. In particular when such a cell is to be used as a memory the loops 84 may be replaced by any other form of memory element such as a static RAM. Data and commands have herein been shown as being presented in serial form to each cell. With simple modification it will be apparent that data and commands may be presented to each cell as a serial succession of parallel digital words.

What I claim is:

1. A wafer scale integrated circuit having a plurality of adjacent data processing cells on a common wafer substrate, the circuit receiving an external synchronizing signal, said cells transfering data and commands between them, said cells comprising:
- a cell address decoding means receiving said commands, said address decoding means operable to monitor a cell address in each said command and provide an output indicative that said command has reached the cell address;
- command decoder means receiving said commands for monitoring an indication portion of said command, and responding to the receipt of said output of said cell address decoding means to provide an output indicative of which one out of a plurality of instructions is selected;
- at least one data processing element coupled to receive the output of said command decoder means and responding to the selected instruction to act upon said data, said data processing element having fixed address storage locations; and,
- transfer means receiving said data and commands and coupled to provide said data and commands to said cell address decoding means and said command decoder means, said transfer means monitoring the output of said cell address decoding means and responding to the absence of an output to provide functional coupling between neighboring cells for said data and commands.

2. The apparatus of claim 1 having input logic coupled between the input of said transfer means and a plurality of neighboring cells for functionally coupling with any exclusive one of said plurality of neighboring cells, said input logic transfering said data and commands; and having output logic coupled between the output of said transfer means and a plurality of neighboring cells for functionally coupling with any exclusive one of said plurality of neighboring cells, said output logic transfering said data and commands.

3. The apparatus of claim 2 having a fast reply line which receives data to be read out from the said data processing elements, said fast reply line coupled to said input logic and output logic of each cell such that data is read directly out through each cell without clocking pulses.

4. The apparatus of claim 3 including a storage loop address decoder coupled to receive said commands from said transfer means for decoding from said command word a selected address in said at least one data processing element.

5. The apparatus of claim 4 including storage loop control logic for receiving outputs from said command decoder and said storage loop address decoder to control data entering and leaving said data processing elements.

6. An integrated circuit according to claim 5 wherein said transfer means is a serial-in, serial-out shift register, which is operable to transfer data and commands between said input logic and said output logic.

7. An integrated circuit according to claim 6 wherein said transfer means further comprises:
- a subtractor, coupled intermediately between said serial-in serial-out shift register and said output logic for decrementing the address in any command passing therethrough;
- an adder, coupled intermediately between said input logic and said serial-in serial-out shift register, coupled to receive said output of said address decoder and operable, in response to the absence of said output from address decoder, to increment the address in a subsequent command;
- said command words having actual command words and an initial dummy command word having all zeros;
- whereby, the address in an actual command subsequent to an initial dummy command is decremented by a subtractor in said one neighboring cell and is not re-incremented by said adder upon entry into said at least one of said cells.

8. An integrated circuit according to claim 7 wherein said address decoder means comprises:
- an all-zeros detector, coupled to monitor the contents of a first plurality of predetermined locations in said serial-in serial-out shift register and operable to provide an output indicative of said contents of said first plurality of predetermined locations simultaneously being zero; and,
- an address latch, coupled to receive said output from said all-zeros detector, coupled to receive an external synchronizing signal, and operable in response to the receipt of said external synchronizing signal, to acquire and hold as an output the indication from said output of said all zeros detector, where, said external synchronizing signal is indicative of a complete command having been entered into said serial-in serial-out shift register.

9. An integrated circuit according to claim 8 wherein said command decoder means comprises:
- a command decoder, coupled to monitor the contents of a second plurality of locations in said serial-in serial-out shift register, and operable in response thereto to provide and output indicative of an instruction to be obeyed; and,
- a latch, coupled to receive the same input as said command decoder, coupled to receive said external synchronizing signal, and operable in response to the receipt of said external synchronizing signal to acquire and hold the indication instantly provided as the input to said command decoder.

10. An integrated circuit according to claim 9 wherein said one or more data processing elements comprises one or more individually addressable data storage shift registers.

11. An integrated circuit according to claim 10 wherein said one or more data storage shift register loops can select one of: accepting an input data stream from said one neighboring cell from said input logic; storing said input data stream and providing back to said input logic for transfer to said one neighboring cell, previously stored contents which are replaced by said input data stream; cycling previously stored contents from finish to start of a shift register for the re-storing of the previously stored contents, at the same time providing as output to said input logic for transfer to said one neighboring cell, a replica of the re-stored contents.

12. An integrated circuit according to claim 5 wherein said one or more data processing elements comprises one or more individually addressable data storage shift register loops where each of said one or more data storage shift register can selectably do one of: accepting an intput data stream from said one neighboring cell from said intput logic; storing said input data stream and providing, back to said input logic for transfer to said one neighboring cell, previously stored contents which are replaced by said input data stream; cycling previously stored contents from finish to start of a shift register for the restoring of the previously stored contents, at the same time providing as output to said input logic for transfer to said one neighboring cell, a replica of the re-stored contents.

13. An integrated circuit according to claim 12 wherein said plurality of cells on said common wafer substrate are laid down in a tessellation on said substrate and wherein said integrated circuit comprises an input-/output port for providing external functional coupling to said integrated circuit, said input/output port being formed by the omission of one of the cells from one of the sites of said tessellation, functional coupling being provided from the site where a cell is omitted to at least one abutting cell adjacent to said port.

* * * * *

UNITED STATES PATENT AND TRADEMARK OFFICE
CERTIFICATE OF CORRECTION

PATENT NO. : 4,489,397
DATED : December 18, 1984
INVENTOR(S) : Kin Hong Lee

It is certified that error appears in the above—identified patent and that said Letters Patent is hereby corrected as shown below:

In the Specification, Column 4, line 49, after "2D" insert --also--; Column 6, line 18, delete "but" and substitute --bus--; Column 6, line 20, delete "on" and substitute --to--; Column 6, line 44, delete "16" and substitute --18--; Column 12, Table 5, the column label "VOW" should appear over the unlabeled column "1 0 0 0"; Column 12, Table 5, line 12, after "OUT lines to" insert --0--; Column 12, line 38, delete "in" and insert --is--; Column 18, line 27, delete "TAKE"; Column 18, line 28, after "TO ENCODE:" insert --TAKE--.

Signed and Sealed this

Sixth Day of August 1985

[SEAL]

Attest:

DONALD J. QUIGG

Attesting Officer    Acting Commissioner of Patents and Trademarks